Jan. 26, 1971 N. F. FOSTER 3,558,351

THIN SEMICONDUCTOR FILMS

Filed Dec. 19, 1968

INVENTOR
N. F. FOSTER
BY
ATTORNEY

United States Patent Office 3,558,351
Patented Jan. 26, 1971

3,558,351
THIN SEMICONDUCTOR FILMS
Norman F. Foster, Allentown, Pa., assignor to Bell Telephone Laboratories, Incorporated, Murray Hill and Berkeley Heights, N.J., a corporation of New York
Filed Dec. 19, 1968, Ser. No. 785,228
Int. Cl. C23c *13/04;* H01v *7/02*
U.S. Cl. 117—201 7 Claims

ABSTRACT OF THE DISCLOSURE

The specification describes a method for depositing thin films of piezoelectric materials in which the crystallographic orientation is controlled by adding a hydrocarbon to the vacuum chamber when initiating deposition and by controlling the angle at which the depositing ions, atoms or molecules meet the substrate. By this method highly oriented films of zinc oxide, adapted for piezoelectric operation in the shear mode, can be produced.

Figures 1, 2:
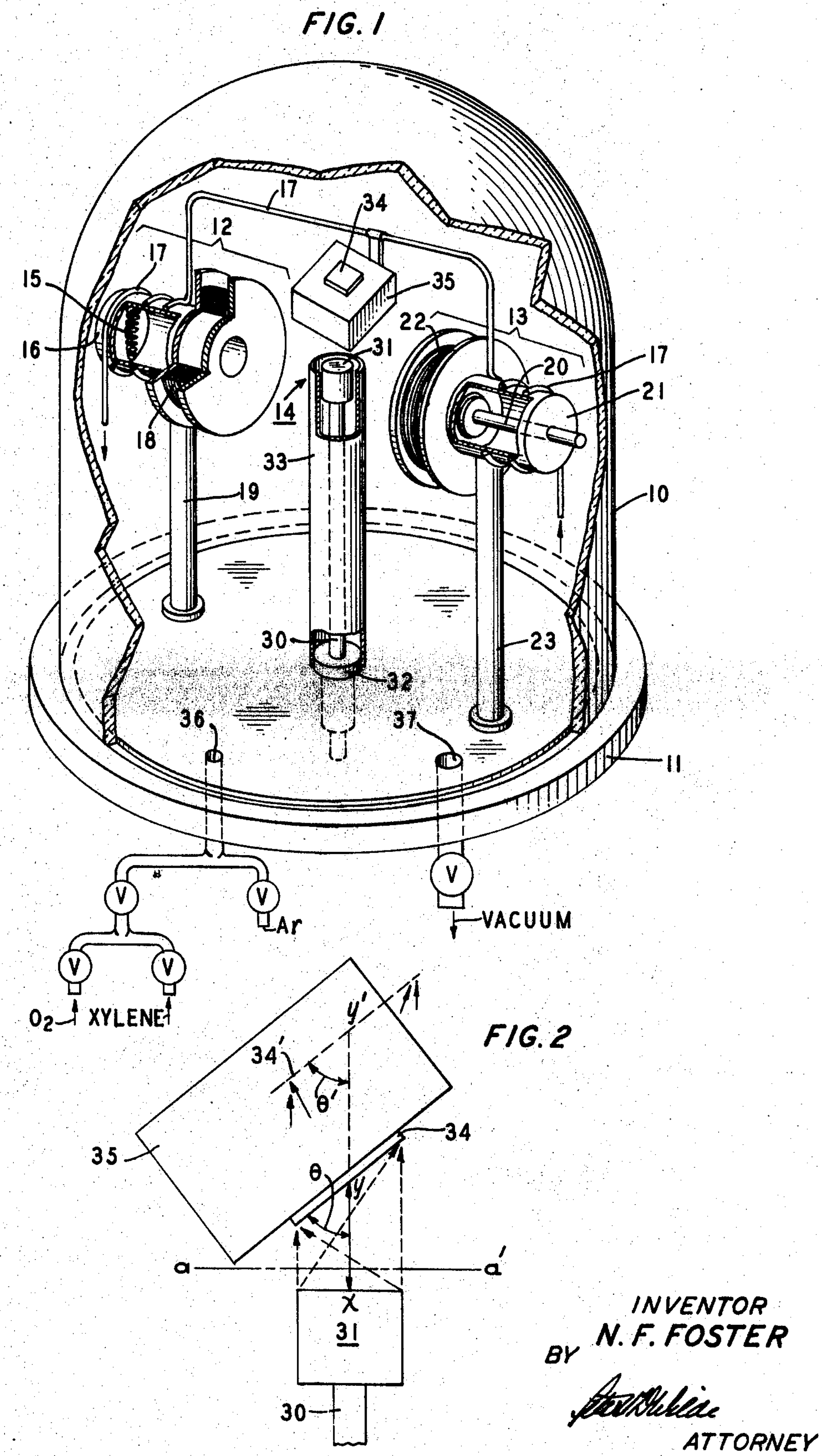

This invention relates to the deposition of thin films having controlled crystallographic orientations.

The deposition of oriented thin films is important in many semiconductor processes. Of these, specific attention will be directed to the deposition of thin films for piezoelectric transducers. In such processes the crystallographic orientation of the film is always important due to the anisotropic nature of the piezoelectric phenomenon. However, it should be understood that the description has general application to the deposition of thin films for a large variety of other devices such as barrier layer devices, electro-optic devices, etc.

Piezoelectric devices such as oscillators and filters have been commercially important for many years. Piezoelectric transducers for ultrasonic delay lines have received much attention. However, the bulk of this art has evolved during a period in which the frequency range of interest was, by current standards, relatively low. Devices operating at these frequencies are typically self-supporting crystals which are mechanically cut from a bulk crystal and ground to the desired frequency. Current interest includes frequencies above 100 mHz. and a resonator for a piezoelectric device operating above this frequency value must have a thickness in the sub-mil range. With this requirement the methods previously used for making resonant crystals are no longer practical. Thus, there is considerable current activity directed toward methods for making transducer elements by thin film techniques.

A commonly discussed method for depositing thin films of piezoelectric materials involves cathode sputtering. Such a choice is obvious in view of the refractory and relatively non-conducting properties of most of the common piezoelectric materials. Among the materials of interest for high frequency transducers and wave filters are cadmium sulfide, zinc oxide, lithium niobate, and lithium tantalate. These materials can be sputtered by conventional sputtering techniques. It has been found that films sputtered by these techniques show a characteristic and reproducible crystal orientation. Specifically, the active piezoelectric axis, which in these materials is the C-axis, aligns normal to the substrate. Such an orientation is satisfactory for producing a longitudinal elastic wave but is limited to this mode. It is known that shear waves characteristically propagate more slowly than longitudinal waves so that there is a distinct advantage in having shear wave transducers for ultrasonic delay lines. For a transducer of the type described here to effectively generate shear waves, the C-axis should be in, or close to, the plane of the transducer or at some specific angle to this plane. Until now, no procedure was known for reproducibly depositing thin films of for example, zinc oxide, with the C-axis in the film plane.

The present invention is broadly directed to a method for influencing the crystallographic alignment of thin films. In its limited or preferred form it involves the deposition of zinc oxide thin films in which the C-axis is parallel, or nearly parallel, to the plane of the film. This result is obtained in each case by controlling the angle of incidence of the vapor onto the substrate and by injecting a hydrocarbon vapor into the deposition ambient. These steps have been found to affect the orientation of the film such that good quality shear mode transducers can be produced. The mechanism through which these expedients affect the orientation of the deposited film is not wholly understood but it is postulated that the hydrocarbon vapors polymerize in the discharge, covering the substrate with an organic film on which the zinc oxide grows with a parallel orientation. This results in a random C-axis within the growth plane. Alignment of the C-axis in this plane is the consequence of oblique deposition whereby the crystallites orient preferentially with their C-axis toward the target.

These and other aspects of the invention may be more fully appreciated from the following detailed description. In the drawing:

FIG. 1 is a perspective view, partly in section with portions cut away to facilitate viewing, of an apparatus useful for carrying out the process of this invention; and FIG. 2 is a front elevation of the target and substrate of FIG. 1 to expedite an explanation of how the relative positions of these elements influence the behavior of the deposition.

An apparatus suitable for depositing thin oriented films in accordance with the invention is shown in FIG. 1. A standard bell jar 10 and baseplate 11 are used for the vacuum station. Contained within the jar is a triode sputtering system comprising the electron source 12, the primary anode assembly 13 and the cathode source 14. The electron source is a hot filament 15 contained in a housing 16 and cooled by cooling coil 17. A magnetic deflection coil 18 is used to focus the electron beam. The source rests on support 19. The anode assembly 13 is similarly constructed, with an anode rod 20, housing 21 and sharing the cooling coil 17 with the electron source. A magnetic deflection coil 22 is used here also. Support 23 completes the anode assembly. The target 14 comprises a conductive rod 30 as a pedestal for the source material 31. The rod is anchored in baseplate 11 by bushing 32, and is connected to the negative terminal of a voltage source (not shown). A cylindrical shield 33 surrounds the rod 30 to confine sputtering to the source 31. The substrate 34 is mounted on a support block 35 and positioned adjacent to source 31. The angular orientation of the substrate with respect to the source is an important aspect of the process as will be discussed below. The baseplate 11 is fitted with opening 36 for admitting gas or vapor to the vacuum chamber. Opening 37 is provided for vacuum.

The following example describes a typical process according to the invention.

The objective is to sputter a zinc oxide film oriented for shear wave operation. The substrate 34 is quartz or sapphire covered with a gold electrode film. Ordinarily the substrate would be selected on the basis of the properties desired for the final ultrasonic device. In the case of a delay line the substrate would be a material such as fused silica, quartz or one of the well-known delay line glasses. The electrode materials commonly used are Au, Ag, and Al. The distance separating the target and substrate is 2 cm., and the target is a ZnO disk 2.2 cm. in diameter and 3 mm. thick, made from ZnO powder by pressing and sintering. The substrate is inclined at an angle of 45° with respect to the source. The film thickness is continuously monitored by optical interference. The primary anode potential is +60 volts with respect to ground and the cathode potential is −1500 volts.

Argon was then admitted to the vacuum chamber in an amount of approximately 2–3$\mu$ with about 0.2$\mu$ of xylene vapor. The xylene is a representative hydrocarbon which was found to effect the initial crystal orientation of the deposited film. Afer deposition is established, e.g., 0.2$\mu$ of ZnO, the hydrocarbon additive is no longer necessary and the standard argon-oxygen mixture, 20 percent $O_2$ (the usual mixture contains 3 percent to 50 percent $O_2$), can be used for the remainder of the deposition. Deposition is continued until the desired thickness is reached. The thickness can be monitored continuously by optical interference. Films having thicknesses of 0.25$\mu$ to 4.0$\mu$ were produced using this technique and have generated essentially pure shear waves when operated as ultrasonic transducers. The polarization direction of the shear waves further shows that the C-axes of the crystallites are oriented with their average direction towards the target and the strength of the piezoelectric shear coupling (60 percent of the single crystal value) indicates that this orientation is well developed. The substrate can be heated to 100° C. to 300° C. to encourage ordering especially at high deposition rates but heating is not essential.

While the hydrocarbon additive in this example is xylene, many other hydrocarbons are satisfactory. Those specifically recommended are set forth in the following list:

cyclohexene
heptene-2
2,5-dimethyl-2,4-hexadiene
styrene
toluene
benzene
cyclohexane
hexane
naphthalene
pentamethylbenzene
ethylene
acetylene
propane From this list it is evident that hydrocarbons, in general, form a class of materials which, when used according to the teachings of the invention, are capable of influencing the crystal orientation of deposited thin films. Other organic materials which are also especially suitable are organosilicon compounds such as di- and tri-alkyl silanes, and ferrocene. Exemplary of the former are triethylsilane, diethylvinylsilane, and vinyltrimethylsilane. Dimethylpolysiloxane is also suitable. The substituted hydrocarbons and especially the metal salts might be suspected as contaminants in some systems. However, this has not been verified and the small amounts involved may be completely tolerable. On the other hand according to this consideration, the pure hydrocarbon would be preferred as clearly avoiding such a problem due to their chemical and electrical inertness.

The hydrcarbon additive encourages crystal orientation in the plane of the film but with random orientation of the C-axis in this plane. To obtain the crystalline orientation desired for a significant piezoelectric effect it is important also to control the C-axis orientation within the plane by depositing the vapor at a controlled angle with respect to the substrate. If the vapor is incident on the substrate at an oblique angle the material depositing will reliably orient with the C-axis in the plane of the angle. By controlling the angle of deposition in combination with the use of the additive described above for initiating properly oriented deposition, thin piezoelectric films can be formed which reliably produce shear waves.

The directionally controlled deposition will be described more fully in connection with FIG. 2. The substrate 34 is mounted with its major plane oblique with respect to the plane of the source 31. The direction of flow of the ions as they deposit on the substrate 34 will encompass a broad range or angles falling within the extremes represented by the arrows. The distribution of vapor across the plane *a–a′* will be reasonably uniform but it will be non-uniform over the inclined surface of the substrate. The actual quantitative distribution of material on the substrate surface as related to the angle of incidence of the depositing ions is complex, but the average angle of incidence can be usefully approximated by the line *x–y* joining the midpoints of the substrate and source. It will be appreciated that this line is not necessarily a normal to the source surface since either of the elements can be displaced to the right or left of the drawing. The minimum angle $\theta$ that line *xy* makes with the substrate represents the critical relationship according to the invention and must be sufficiently acute so that the material deposits in an oriented fashion. A range of 20° to 70° is suitable for this purpose. Below 20° the angle is so slight that the deposit becomes excessively non-uniform in thickness. Above 70° reliable orientation is difficult to achieve. The distance separating the source and substrate surface for a given angle $\theta$ has little effect on the deposition angle. For instance, if the substrate surface in FIG. 2 was moved to 34′, the distance separating the middle of the source and the middle of the substrate would be *xy′*. The new angle $\theta'$ could change (if *xy* and *xy′* are not normal to 31 and 34′ is not displaced sideways) but only very slightly so that the assumed approximation of $\theta'$ being the representative angle or deposition would still be valid. The directions indicated by the arrows which are incident on surface 34′ are all oblique to the surface in the same quadrant while one of the arrows denoting deposition of surface 34 is actually opposed to the desired direction. This apparent enhancement of the directionality occasioned by greater source-substrate separation is offset by the larger angle at which the material arrives at from the extreme left side of the source as it appears in FIG. 1. Thus the angle $\theta$ is a reasonably reliable parameter to use to describe effective angular deposition.

The variation in the thickness across the substrate that is produced by oblique sputtering can be reduced, with a decrease in deposition rate, by increasing the separation between the source and substrate. Another method for reducing the thickness non-uniformity is to vary the plasma density across the source. This can be done by appropriately designing the apparatus so that the surface of the source is exposed to a diminishing plasma intensity. The same result can be achieved through the use of magnetic fields to shape the plasma as is well known.

The specific embodiment set forth above describes a sputtering process in which the zinc oxide is sputtered directly from a zinc oxide cathode. A well-known alternative to this is to reactively sputter a zinc cathode in oxygen or to employ an oxygen plasma in a process such as that described in U.S. Pat. No. 3,287,243 issued to J. R. Ligenza on Nov. 22, 1966. The technique of this invention serves to influence the crystal orientation of the material being deposited as it arrives at the substrate and therefore the origin of the ions or vapor being deposited is immaterial to its success.

The method of the invention is of interest primarily for the deposition of semiconductive materials. As a general rule semiconductive materials fall within the range of resistivities between $10^{-2}$ and $10^{-7}$ ohm cm.

This method is also useful in conjunction with the teachings of application Ser. No. 785,268 filed Dec. 19, 1968 of R. S. Duncan for producing piezoelectric films having crystal orientations adapted for operation in the torsional mode.

What is claimed is:

1. A method for depositing a crystallographically oriented film of a semiconductive material on a substrate by cathodic sputtering which comprises sputtering from a cathode source onto the substrate through an ambient containing a hydrocarbon additive to form a layer of semiconductive material having a predominant plane of crystallographic orientation the plane of orientation being different from that obtained in the absence of the hydrocarbon additive in the ambient, and positioning the plane of the substrate at an acute angle with respect to said source so that material forming said layer is incident on the substrate at an average angle in the range of 20° to 70° to determine the direction of crystal orientation of the layer within the aforementioned plane.

2. The method of claim 1 wherein the layer comprises a compound selected from the group consisting of zinc oxide, cadmium sulfide, lithium niobate and lithium tantalate.

3. The method of claim 2 wherein the hydrocarbon additive is xylene.

4. A method for depositing a thin film of zinc oxide with a predominant orientation of the piezoelectric or C-axis unidirectional in the plane of the film which comprises sputtering from a zinc oxide cathode through an ambient comprising an inert gas containing a hydrocarbon additive onto a substrate exposed to said gas to form a layer of zinc oxide having the C-axis predominantly oriented in the plane of the film and positioning the substrate with respect to the cathode so that the average angle of incidence of the zinc oxide on the substrate as it deposits is in the range of 20° to 70° thereby forming the C-axis substantially unidirectional in the plane of the film.

5. The method of claim 4 wherein the exposure of the substrate to free radicals is discontinued after a substantial thickness of zinc oxide is obtained.

6. The method of claim 5 wherein the ambient comprises an inert gas containing at least 3 percent oxygen during at least a portion of the deposition.

7. The method of claim 6 wherein the inert gas is argon.

References Cited

UNITED STATES PATENTS

| | | | |
|---|---|---|---|
| 3,388,002 | 6/1968 | Foster | 117—217 |
| 3,457,156 | 7/1969 | Fisher | 117—93.1 |

WILLIAM L. JARVIS, Primary Examiner

U.S. Cl. X.R.

117—93.1, 106; 204—192